(12) United States Patent
Fayneh et al.

(10) Patent No.: US 11,408,932 B2
(45) Date of Patent: Aug. 9, 2022

(54) INTEGRATED CIRCUIT WORKLOAD, TEMPERATURE AND/OR SUBTHRESHOLD LEAKAGE SENSOR

(71) Applicant: PROTEANTECS LTD., Haifa (IL)

(72) Inventors: Eyal Fayneh, Givatayim (IL); Inbar Weintrob, Givat-Ada (IL); Evelyn Landman, Haifa (IL); Yahel David, Kibbutz Gazit (IL); Shai Cohen, Haifa (IL); Guy Redler, Haifa (IL)

(73) Assignee: PROTEANTECS LTD., Haifa (IL)

( * ) Notice: Subject to any disclaimer, the term of this patent is extended or adjusted under 35 U.S.C. 154(b) by 106 days.

(21) Appl. No.: 16/960,421

(22) PCT Filed: Jan. 8, 2019

(86) PCT No.: PCT/IL2019/050039
§ 371 (c)(1),
(2) Date: Jul. 7, 2020

(87) PCT Pub. No.: WO2019/135247
PCT Pub. Date: Jul. 11, 2019

(65) Prior Publication Data
US 2020/0333393 A1 Oct. 22, 2020

Related U.S. Application Data

(60) Provisional application No. 62/614,706, filed on Jan. 8, 2018.

(51) Int. Cl.
*G01R 31/28* (2006.01)
*G01R 31/52* (2020.01)
*G01K 7/00* (2006.01)

(52) U.S. Cl.
CPC .......... *G01R 31/2884* (2013.01); *G01K 7/00* (2013.01); *G01R 31/52* (2020.01)

(58) Field of Classification Search
CPC ............... G01R 31/2884; G01R 31/52; G01R 31/2621; G01K 7/00; G01K 7/346; G01K 7/32
(Continued)

(56) References Cited

U.S. PATENT DOCUMENTS 5,748,509 A 5/1998 Fewster
5,774,403 A 6/1998 Clark, II et al.
(Continued)

FOREIGN PATENT DOCUMENTS

CN 102273077 B 9/2014
CN 108534866 A 9/2018
(Continued)

OTHER PUBLICATIONS

Kan Takeuchi et al; "FEOL/BEOL wear-out estimator using stress-to-frequency conversion of voltage/temperature-sensitive ring oscillators for 28nm automotive MCUs"; IEEE; pp. 265-268; Oct. 20, 2016.
(Continued)

*Primary Examiner* — Giovanni Astacio-Oquendo
(74) *Attorney, Agent, or Firm* — The Roy Gross Law Firm, LLC; Roy Gross

(57) ABSTRACT

Determination of one or more operating conditions (leakage current, temperature and/or workload) of a functional transistor in a semiconductor integrated circuit (IC). The functional transistor provides an electrical current, which is provided as an input to a ring oscillator (ROSC). The ROSC is located in the IC proximate to the functional transistor and has an oscillation frequency in operation. The one or more operating conditions of the functional transistor are determined based on the oscillation frequency of the ROSC.

22 Claims, 8 Drawing Sheets

(58) Field of Classification Search
USPC .................................... 324/750.3, 537, 500
See application file for complete search history.

(56) References Cited

U.S. PATENT DOCUMENTS

| | | | |
|---|---|---|---|
| 5,818,251 | A | 10/1998 | Intrater |
| 5,895,629 | A | 4/1999 | Russell et al. |
| 5,956,497 | A | 9/1999 | Ratzel et al. |
| 5,966,527 | A | 10/1999 | Krivokapic et al. |
| 6,182,253 | B1 | 1/2001 | Lawrence et al. |
| 6,683,484 | B1 | 1/2004 | Kueng et al. |
| 6,807,503 | B2 | 10/2004 | Ye et al. |
| 6,873,926 | B1 | 3/2005 | Diab |
| 6,882,172 | B1 | 4/2005 | Suzuki |
| 6,948,388 | B1 | 9/2005 | Clayton et al. |
| 7,038,483 | B1 | 5/2006 | Suzuki et al. |
| 7,067,335 | B2 | 6/2006 | Weiner et al. |
| 7,254,507 | B2 | 8/2007 | Dosho et al. |
| 7,369,893 | B2 | 5/2008 | Gunderson |
| 7,443,189 | B2 | 10/2008 | Ramappa |
| 7,501,832 | B2 | 3/2009 | Spuhler et al. |
| 7,649,373 | B2* | 1/2010 | Tokunaga .......... G01R 19/16552 324/750.3 |
| 7,818,601 | B2 | 10/2010 | LaBerge |
| 7,877,657 | B1 | 1/2011 | Miller et al. |
| 8,001,512 | B1 | 8/2011 | White |
| 8,086,978 | B2 | 12/2011 | Zhang et al. |
| 8,310,265 | B2 | 11/2012 | Zjajo et al. |
| 8,365,115 | B2 | 1/2013 | Liu et al. |
| 8,418,103 | B2 | 4/2013 | Wang et al. |
| 8,825,158 | B2 | 9/2014 | Swerdlow |
| 9,424,952 | B1 | 8/2016 | Seok et al. |
| 9,536,038 | B1 | 1/2017 | Quinton et al. |
| 9,564,883 | B1 | 2/2017 | Quinton et al. |
| 9,564,884 | B1 | 2/2017 | Quinton et al. |
| 9,632,126 | B2* | 4/2017 | Yoon .................. G01R 31/52 |
| 9,714,966 | B2 | 7/2017 | Chen et al. |
| 9,760,672 | B1 | 9/2017 | Taneja et al. |
| 9,954,455 | B2 | 4/2018 | Lin et al. |
| 10,509,104 | B1 | 12/2019 | Dato |
| 10,530,347 | B2 | 1/2020 | Tang |
| 11,081,193 | B1 | 8/2021 | Tang |
| 2004/0009616 | A1 | 1/2004 | Huisman et al. |
| 2004/0230385 | A1 | 11/2004 | Bechhoefer et al. |
| 2005/0114056 | A1 | 5/2005 | Patel et al. |
| 2006/0049886 | A1 | 3/2006 | Agostinelli, Jr. et al. |
| 2007/0182456 | A1 | 8/2007 | Agarwal et al. |
| 2008/0074521 | A1 | 3/2008 | Olsen |
| 2008/0144243 | A1 | 6/2008 | Mariani et al. |
| 2008/0147355 | A1 | 6/2008 | Fields et al. |
| 2008/0183409 | A1 | 7/2008 | Roberts et al. |
| 2008/0186001 | A1 | 8/2008 | Singh et al. |
| 2008/0186044 | A1 | 8/2008 | Singh |
| 2008/0262769 | A1 | 10/2008 | Kadosh |
| 2009/0027077 | A1 | 1/2009 | Vijayaraghavan |
| 2009/0096495 | A1 | 4/2009 | Keigo |
| 2009/0183043 | A1 | 7/2009 | Niwa |
| 2009/0230947 | A1* | 9/2009 | Sumita .................. H03K 5/12 327/160 |
| 2009/0244998 | A1 | 10/2009 | Kim |
| 2009/0273550 | A1 | 11/2009 | Vieri et al. |
| 2009/0278576 | A1 | 11/2009 | Chakravarty |
| 2009/0306953 | A1 | 12/2009 | Liu et al. |
| 2010/0251046 | A1 | 9/2010 | Mizuno et al. |
| 2010/0253382 | A1 | 10/2010 | Wang |
| 2011/0093830 | A1 | 4/2011 | Chen et al. |
| 2011/0102091 | A1 | 5/2011 | Yeric |
| 2011/0109377 | A1 | 5/2011 | Fujibe |
| 2011/0187433 | A1 | 8/2011 | Baumann et al. |
| 2011/0267096 | A1 | 11/2011 | Chlipala |
| 2011/0295403 | A1 | 12/2011 | Higuchi et al. |
| 2011/0315986 | A1 | 12/2011 | Kaneda et al. |
| 2012/0025846 | A1 | 2/2012 | Minas et al. |
| 2012/0038388 | A1 | 2/2012 | Tseng et al. |
| 2012/0074973 | A1* | 3/2012 | Baldwin ............ G01R 31/2831 324/750.3 |
| 2012/0163074 | A1 | 6/2012 | Franca-Neto et al. |
| 2012/0217976 | A1 | 8/2012 | Clarkson |
| 2013/0226491 | A1 | 8/2013 | Miguelanez, II |
| 2013/0335875 | A1 | 12/2013 | Baumann |
| 2014/0132293 | A1 | 5/2014 | Abadir |
| 2014/0184243 | A1 | 7/2014 | Iyer et al. |
| 2015/0061707 | A1 | 3/2015 | Balasubramanian et al. |
| 2015/0199223 | A1 | 7/2015 | Banerjee et al. |
| 2015/0365049 | A1 | 12/2015 | Ozawa |
| 2016/0042784 | A1 | 2/2016 | Rim et al. |
| 2016/0131708 | A1 | 5/2016 | Huang et al. |
| 2016/0153840 | A1 | 6/2016 | Huang et al. |
| 2016/0156176 | A1* | 6/2016 | Kunz, Jr. ............... H01L 25/00 361/56 |
| 2016/0164503 | A1* | 6/2016 | Kim .................... H03K 3/35625 327/203 |
| 2016/0203036 | A1 | 7/2016 | Mezic et al. |
| 2017/0038265 | A1 | 2/2017 | Abdelmoneum et al. |
| 2017/0199089 | A1 | 7/2017 | Man et al. |
| 2017/0199228 | A1 | 7/2017 | Hsieh et al. |
| 2017/0214516 | A1 | 7/2017 | Rivaud et al. |
| 2017/0364818 | A1 | 12/2017 | Wu et al. |
| 2018/0365974 | A1 | 12/2018 | Haas et al. |
| 2019/0019096 | A1 | 1/2019 | Yoshida et al. |
| 2019/0117122 | A1 | 4/2019 | Kurachi et al. |

FOREIGN PATENT DOCUMENTS

| | | |
|---|---|---|
| DE | 102012219971 A1 | 7/2016 |
| EP | 2006784 A1 | 12/2008 |
| EP | 2060924 A1 | 5/2009 |
| EP | 2413150 A1 | 2/2012 |
| JP | 2009065533 A | 3/2009 |
| KR | 2013110989 A | 10/2013 |
| WO | 2019097516 A1 | 5/2019 |
| WO | 2019102467 A1 | 5/2019 |
| WO | 2019135247 A1 | 7/2019 |
| WO | 2019202595 A1 | 10/2019 |
| WO | 2019244154 A1 | 12/2019 |
| WO | 2020141516 A1 | 7/2020 |
| WO | 2020230130 A1 | 11/2020 |
| WO | 2021019539 A1 | 2/2021 |
| WO | 2021214562 A1 | 10/2021 |
| WO | 2022/009199 A1 | 1/2022 |

OTHER PUBLICATIONS

Kan Takeuchi et al; "Wear-out stress monitor utilising temperature and voltage sensitive ring oscillators" IET Circuits, Devices & Systems; vol. 12 No. 2, pp. 182-188; Jan. 15, 2018.

Kan Takeuchi et al; "Experimental Implementation of 8.9Kgate Stress Monitor in 28nm MCU along with Safety Software Library for IoT Device Maintenance"; IEEE International Reliability Physics Symposium (IRPS); Mar. 31, 2019.

Dan Ernst et al; "Razor: A Low-Power Pipeline Based on Circuit-Level Timing Speculation"; Appears in the 36th Annual International Symposium on Microarchitecture (MICRO-36); Dec. 1, 2003.

Dan Ernst et al; "Razor: Circuit-Level Correction of Timing Errors for Low-Power Operation" IEEE Computer Society; Nov. 30, 2004.

International Search Report of PCT/IL2019/050039 Completed May 7, 2019; dated May 7, 2019 5 Pages.

Written Opinion of PCT/IL2019/050039 Completed May 7, 2019; dated May 7, 2019 5 Pages.

James P. Hofmeister, et al., "Ball Grid Array (BGA) Solder Joint Intermittency Detection: SJ BIST™", IEEE Aerospace Conference Proceedings, Apr. 2008, paper #1148, Version 1.

Paulheim, H & Meusel, R. "A decomposition of the outlier detection problem into a set of supervised learning problems", Machine Learning, Sep. 2015, vol. 100 Issue 2, pp. 509-531. Retrieved Oct. 7, 2021; DOI 10.1007/s10994-015-5507-y.

Zhang, L., Marron, J.S., Shen, H., Zhu, Z., "Singular value decomposition and its visualization", Journal of Computational and Graphical Statistics, Dec. 2007, vol. 6 Issue 4, pp. 833-854. DOI: 10.1198/106186007X256080.

(56) References Cited

OTHER PUBLICATIONS

Shinkai, Ken-ichi et al. "Device-parameter estimation with on-chip variation sensors considering random variability."; In 16th Asia and South Pacific Design Automation Conference (ASP-DAC 2011), pp. 683-688 IEEE, Jan. 25, 2011. Retrieved Oct. 7, 2021 from: https://citeseerx.ist.psu.edu/viewdoc/download?doi=10.1.1.188.2030&rep=rep1&type=pdf.

Weiwei Shan et al. "An improved timing error prediction monitor for wide adaptive frequency scaling"; IEICE Electronics Express, vol. 14, No. 21, pp. 1-6, Oct. 20, 2017. Retrieved Oct. 7, 2021; DOI: 10.1587/elex14.20170808.

Agilent Technologies; "Clock Jitter Analysis with femto-second resolution"; Jan. 1, 2008.

Yousuke Miyake et al; "Temperature and voltage estimation using ring-oscillator-based monitor for field test"; IEEE 23rd Asian Test Symposium; pp. 156-161, Nov. 16, 2014. Retrieved Oct. 7, 2021; DOI 10.1109/ATS.2014.38.

Basab Datta at al.; "Analysis of A Ring Oscillator Based on Chip Thermal Sensor in 65nm Technology"; Online at: https://web.archive.org/web/20140328234617/http://www-unix.ecs.umass.edu/~dkumar/lab4_658_report/lab4_report.htm; Sep. 5, 2018.

Tilman Wolf et al; "Collaborative Monitors for Embedded System Security". Jan. 1, 2006. First Workshop on Embedded System Security in conjunction with EMSOFT'06, Oct. 26, 2006, Seoul, South Korea.

Sandeep,Kumar Samal et al.; "Machine Learning Based Variation Modeling and Optimization for 3D ICs"; J. Inf. Commun. Converg. Eng. 14(4): 258-267, Dec. 2016. Retrieved Oct. 7, 2021; DOI: 10.6109/jicce.2016.14.4.258.

Yin-Nien Chen et al; "Impacts of Work Function Variation and Line-Edge Roughness on TFET and FinFET Devices and 32-Bit CLA Circuits"; J. Low Power Electron. Appl. 2015, 5, 101-115. May 21, 2015. Retrieved Oct. 7, 2021 doi:10.3390/jlpea5020101.

Yong Zhao et al; "A Genetic Algorithm Based Remaining Lifetime Prediction for a VLIW Processor Employing Path Delay and IDDX Testing"; IEEE; Apr. 12, 2016.

Vivek S Nandakumar et al, "Statistical static timing analysis flow for transistor level macros in a microprocessor"; 2010, 11th International Symposium on Quality Electronic Design (ISQED), pp. 163-170, Mar. 22, 2010. doi: 10.1109/ISQED.2010.5450412.

Jing Li et al, "Variation Estimation and Compensation Technique in Scaled LTPS TFT Circuits for Low-Power Low-Cost Applications"; IEEE Transactions on Computer-Aided Design of Integrated Circuits and Systems, vol. 28(1): 46-59, Jan. 1, 2009. doi: 10.1109/TCAD.2008.2009149.

Xie Qing et al "Variation-Aware Joint Optimization of the Supply Voltage and Sleep Transistor Size for 7nm FinFET Technology"; 2014 IEEE 32nd international conference on computer design, pp. 380-385, Oct. 19, 2014. doi: 10.1109/ICCD.2014.6974709.

Rebaud B et al ,"Timing slack monitoring under process and environmental variations: Application to a DSP performance optimization"; Microelectronics Journal vol. 42 Issue 5, pp. 718-732, Feb. 8, 2011. DOI:10.1016/j.mejo.2011.02.005.

Dierickx B et al, "Propagating variability from technology to system Level"; Physics of Semiconductor Devices, pp. 74-79, Dec. 16, 2007. doi: 10.1109/IWPSD.2007.4472457.

\* cited by examiner

INTEGRATED CIRCUIT WORKLOAD, TEMPERATURE AND/OR SUBTHRESHOLD LEAKAGE SENSOR

CROSS REFERENCE TO RELATED APPLICATIONS

This application is a National Phase of PCT Patent Application No. PCT/IL2019/050039 having International filing date of Jan. 8, 2019, which claims the benefit of priority of U.S. Provisional Patent Application No. 62/614,706 "INTEGRATED CIRCUIT SUB-THRESHOLD LEAKAGE SENSOR", filed Jan. 8, 2018. The contents of the above applications are all incorporated by reference as if fully set forth herein in their entirety.

FIELD OF THE INVENTION

The invention relates to the field of integrated circuits.

BACKGROUND

Integrated circuits (ICs) may include analog and digital electronic circuits on a flat semiconductor substrate, such as a silicon wafer. Microscopic transistors are printed onto the substrate using photolithography techniques to produce complex circuits of billions of transistors in a very small area, making modern electronic circuit design using ICs both low cost and high performance. ICs are produced in assembly lines of factories, termed foundries, which have commoditized the production of ICs, such as complementary metal-oxide-semiconductor (CMOS) ICs. Digital ICs contain billions of transistors, such as metal-oxide-semiconductor field-effect transistor (MOSFETs), arranged in functional and/or logical units on the wafer, with datapaths interconnecting the functional units that transfer data values between the functional units. Each unit has a power source and an associated on power, off power, standby power, and the like.

Digital ICs implement a large number of CMOS-based sub-circuits, each sub circuit associated with an OFF configuration. During the OFF configuration, power may still be consumed by the sub-circuit devices, such as often called static-power consumption. The static (or leakage) power of all the sub-circuits within an IC is summed and may be called the total IC static power.

In digital ICs, sub-threshold leakage may be considered a parasitic leakage in a state that would ideally have no current. Conversely, in micropower analog circuits, weak inversion is an efficient operating region, and subthreshold may be a useful transistor mode around which circuit functions may be designed. Measuring or tracking leakage current and other operational characteristics of the functional units or IC, such as temperature, is therefore desirable.

"Analysis of a Ring Oscillator Based on Chip Thermal Sensor in 65 nm Technology" Datta, Kumar (published on http://archive.vn/loDq) discusses the dependence of delay in a ring oscillator on temperature. Inverter delay normally increases with temperature, such that the ring oscillator frequency reduces with increasing temperature. A chip thermal sensor is proposed based on this principle. It is also suggested that leakage power for the entire chip may be determined using such a sensor. Such sensors have not been considered accurate though, in part because the temperature sensitivity may be a consequence of the process technology of the inverters used in the ring oscillator.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

There is provided, in accordance with an embodiment, a semiconductor integrated circuit (IC) comprising: a functional transistor, having an output providing an electrical current; a ring oscillator (ROSC) circuit, located in the IC proximate to the functional transistor and having an oscillation frequency in operation; and a processor, configured to determine one or more operating conditions of the functional transistor based on the oscillation frequency of the ROSC. Advantageously, the ROSC has an input coupled to receive the electrical current from the output of the functional transistor.

In embodiments, the semiconductor IC further comprises: an enabling part, configured to enable or disable the ROSC in accordance with a received enable signal. Optionally, the enabling part comprises a NAND logic gate as part of the ROSC, a first input of the NAND logic gate being arranged to receive the enable signal and a second input of the NAND logic gate being coupled to an output of the ROSC.

In embodiments, the ROSC comprises at least one skewed inverter.

In embodiments, the processor is configured to use stored simulation results for the oscillation frequency of the ROSC at different operating conditions to determine the one or more operating conditions of the functional transistor.

In embodiments, the ROSC forms part of at least one leakage detection circuit, for instance such that the processor is configured to determine a leakage current for the functional transistor based on the oscillation frequency of the ROSC. Optionally, the at least one leakage detection circuit comprises a sub-threshold bias generator electrically connected to the input voltage of a device under test (DUT), in which the DUT preferably comprises the functional transistor. Then, the ROSC is preferably a first storage circuit that is electrically connected to an output of the DUT. Optionally, the at least one leakage detection circuit comprises an electronic switch electrically connected to the output of the DUT, such as a drain of the functional transistor. The at least one leakage detection circuit advantageously comprises a frequency measurement circuit.

In some embodiments, the at least one leakage detection circuit is a plurality of leakage detection circuits, each measuring the leakage current from one of a plurality of DUTs.

In embodiments, the ROSC and the processor form part of at least one temperature detection circuit, such that the processor is configured to determine a temperature for the functional transistor based on the oscillation frequency of the ROSC. Optionally, the processor is further configured to use stored simulation results for the oscillation frequency of the ROSC at different temperatures to determine the temperature of the functional transistor based on the oscillation frequency of the ROSC: Optionally, the processor is further configured to identify the IC as having a type selected from a group consisting of a plurality of predefined types of IC, the processor storing respective simulation results for the oscillation frequency of the ROSC at different temperatures for each of the predefined types. Optionally, the at least one temperature detection circuit further comprises a current source, an output of the current source providing an input to the ROSC. Optionally, the current source comprises a sub-threshold bias generator coupled to a control terminal of the functional transistor and configured to bias the functional transistor in a sub-threshold state, an output of the functional transistor providing the output of the current source. The sub-threshold bias generator may form part of the at least one leakage detection circuit as herein described. Advantageously, the at least one temperature detection circuit is configured such that the oscillation frequency of the ROSC increases with increasing temperature.

In embodiments, the processor is configured to determine a stress or workload for the IC based on the oscillation frequency of the ROSC. Optionally, the stress or workload for the IC is determined based on a function of one or more of: IC voltage; temperature; and IC activity. Optionally, the processor is further configured to determine the stress or workload at different values of one or both of: a clock frequency for the semiconductor IC; and an operating voltage for semiconductor IC, the processor being configured to provide the stress or workload referenced against the clock frequency and/or operating voltage. Optionally, the stress or workload for the IC represents an aggregate stress or workload over a time interval, the time interval being based on a time duration for measurement of the oscillation frequency of the ROSC. Optionally, the stress or workload for the IC represents an aggregate stress or workload against temperature. Optionally, the stress or workload is represented by one or more of: a number; a ratio with respect to a reference value for all semiconductor ICs; and a ratio with respect to a reference value for semiconductor ICs of the same type. Optionally, the processor is further configured to receive a margin loss for the semiconductor IC and correlate the received margin loss with the stress or workload. Optionally, the processor is further configured to determine a margin loss for the IC based on the determined stress or workload and a stored correlation between stress or workload and margin loss. Optionally, the processor is further configured to selectively enable or disable a Negative-bias temperature instability (NBTI) mode for at least a portion of the semiconductor IC and determine a stress or workload for the NBTI mode when the NBTI mode is enabled. Optionally, the processor is further configured to generate a notification signal based on a comparison of the determined stress or workload with a predetermined criterion, the notification signal being indicative of one or more of: a state or age of the IC; one or more guard-bands for the IC; and a maintenance or replacement condition.

In embodiments, the processor is configured to determine multiple instances of the one or more operating conditions spread over a time period and to store the determined multiple instances of the one or more operating conditions.

In embodiments, the processor is configured to store the determined multiple instances of the one or more operating conditions in one or more of: a non-volatile memory in the semiconductor IC; an external storage device on a local system; and an external storage device on a remote system over a network. Optionally, the processor is configured to determine an aggregate value for the determined multiple instances of the one or more operating conditions over the time period.

In embodiments, the input of ROSC is switchably coupled to receive the electrical current from the output of the functional transistor, such that the processor is configured to determine: a reference frequency based on the oscillation frequency of the ROSC when the input of ROSC does not receive the electrical current from the output of the functional transistor; and a sensor measurement frequency based on the oscillation frequency of the ROSC when the input of ROSC receives the electrical current from the output of the functional transistor.

There is provided, in accordance with an embodiment, a method for determining one or more operating conditions of a functional transistor in a semiconductor integrated circuit (IC). The method comprises: measuring an oscillation frequency at the output of a ring oscillator (ROSC) located in the IC proximate to the functional transistor; determining one or more operating conditions of the functional transistor based on the oscillation frequency of the ROSC. Advantageously, the ROSC receives an electrical current from an output of the functional transistor as an input.

In embodiments, the method further comprises switching to enable or disable the ROSC in accordance with an enable signal. In embodiments, the step of determining uses stored simulation results for the oscillation frequency of the ROSC at different operating conditions to determine the one or more operating conditions of the functional transistor.

In embodiments, the step of determining comprises determining (or detecting) a leakage current from the semiconductor IC, in particular for the functional transistor, based on the oscillation frequency of the ROSC. The functional transistor is beneficially comprised in a device under test (DUT) The method optionally comprises the action of measuring a frequency at the output of a ring oscillator (ROSC) as a reference frequency. The method preferably comprises the action of setting a sub-threshold voltage on an input voltage lead of the at least one DUT using a sub-threshold bias generator electrically connected to the input voltage lead. The method comprises the action of measuring a frequency at the output of the ROSC as a leakage frequency. The method comprises the action of computing a leakage current using a computing device, advantageously based on the leakage frequency. The method optionally comprises the action of closing an electronic switch electrically connected between an output (drain) lead of the at least one DUT and the ROSC. Optionally, the method further comprises: measuring an oscillation frequency at the output of a ring oscillator (ROSC) as a reference frequency, an electronic switch electrically connected between an output of the DUT and the ROSC being set as open during the measurement; and closing the electronic switch prior to the step of measuring a frequency at the output of the ROSC as a leakage frequency.

In embodiments, the method further comprises: determining a temperature of the functional transistor based on the oscillation frequency of the ROSC. Optionally, the step of determining a temperature of the functional transistor is based on the oscillation frequency of the ROSC and stored simulation results for the oscillation frequency of the ROSC at different temperatures. Optionally, the method further comprises: identifying the IC as having a type selected from a group consisting of a plurality of predefined types of IC, the step of determining a temperature further comprising selecting from stored respective simulation results for the oscillation frequency of the ROSC at different temperatures for each of the predefined types, based on the identification. Optionally, the method further comprises: providing an output of a current source as an input to the ROSC. Optionally, the method of claim 40, further comprising: setting a sub-threshold voltage on an input voltage lead of the functional transistor using a sub-threshold bias generator electrically connected to the input voltage lead, such that an output of the functional transistor provides the output of the current source.

In embodiments, the one or more operating conditions comprise a stress or workload for the IC, the stress or workload being determined based on the oscillation frequency of the ROSC. Optionally, the stress or workload for the IC is determined based on a function of one or more of: IC voltage; temperature; and IC activity. Optionally, the step of determining comprises determining the stress or workload at different values of one or both of: a clock frequency for the semiconductor IC; and an operating voltage for semiconductor IC, the method further comprising providing the stress or workload referenced against the clock frequency and/or operating voltage. Optionally, the stress or workload for the IC represents an aggregate stress or workload over a time interval, the time interval being based on a time duration for measurement of the oscillation frequency of the ROSC. Optionally, the stress or workload is represented by one or more of: a number; a ratio with respect to a reference value for all semiconductor ICs; and a ratio with respect to a reference value for semiconductor ICs of the same type. Optionally, the method further comprises determining a reliability margin or margin loss for the IC based on the determined stress or workload and a stored correlation between stress or workload and margin loss. Optionally, the method, further comprises: selectively enabling or disabling a Negative-bias temperature instability (NBTI) mode for at least a portion of the semiconductor IC; and preferably, determining a stress or workload for the NBTI mode when the NBTI mode is enabled. Optionally, the method further comprises: comparing the determined stress or workload with a predetermined criterion. Preferably, the predetermined criterion is based on a statistical lifetime workload for semiconductor ICs of the same type as the semiconductor IC. Optionally, the method further comprises: generating a notification signal based on the comparison, the notification signal being indicative of one or more of: a state or age of the IC; one or more guard-bands for the IC; and a maintenance or replacement condition.

In embodiments, the method further comprises: determining a plurality of sets of stress or workload for the IC, each set of stress or workload being determined from ROSC oscillation frequencies occurring during operation of a respective application by the semiconductor IC. Optionally, each set of stress or workload comprises multiple instances of stress or workload, spread over a time period.

In embodiments, the method further comprises: correlating the stress or workload with a margin loss for the semiconductor IC. Optionally, the method further comprises: calibrating test results for the semiconductor IC based on the stress or workload.

In embodiments, the method further comprises: determining multiple instances of the one or more operating conditions spread over a time period; and storing the determined multiple instances of the one or more operating conditions. Optionally, the step of storing the determined multiple instances of the one or more operating conditions is in one or more of: a non-volatile memory in the semiconductor IC; an external storage device on a local system; and an external storage device on a remote system over a network. Optionally, the method further comprises: determining an aggregate value for the determined multiple instances of the one or more operating conditions over the time period.

In embodiments, the method further comprises: switchably coupling the input of the ROSC to receive the electrical current from the output of the functional transistor; determining a reference frequency based on the oscillation frequency of the ROSC when the input of ROSC does not receive the electrical current from the output of the functional transistor; and/or determining a sensor measurement frequency based on the oscillation frequency of the ROSC when the input of ROSC receives the electrical current from the output of the functional transistor.

Advantageously, the step of determining one or more operating conditions is performed at a computing device. In some embodiments, the computing device is or comprises a circuit on the IC. Additionally or alternatively, the computing device is or comprises an external device to the semiconductor IC. In the latter case, the method may further comprise receiving, by the computing device, a plurality of oscillation frequencies and wherein the determining is performed using a fitted function taking as input the plurality of oscillation frequencies. Optionally, the method further comprises receiving, by the computing device, a plurality of oscillation frequencies each from a respective one of a plurality of ICs. In some embodiments, the method further comprises sending the reference frequency and the sensor (e.g. leakage) frequency to the computing device.

In some embodiments, the method further comprises receiving, by the computing device, a plurality of reference frequencies and a corresponding plurality of sensor (leakage) frequencies, and wherein the computing is performed using a fitted function taking as input the plurality of reference frequencies and the corresponding plurality of sensor (leakage) frequencies.

In some embodiments, the method further comprises receiving, by the computing device, a plurality of frequency pairs from a plurality of ICs, wherein each of the plurality of frequency pairs comprises a reference and sensor (leakage) frequency.

In addition to the exemplary aspects and embodiments described above, further aspects and embodiments will become apparent by reference to the figures and by study of the following detailed description. Moreover, the various features and embodiments of the invention described above are specifically contemplated to be used alone as well as in various combinations.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION

Figure 1:
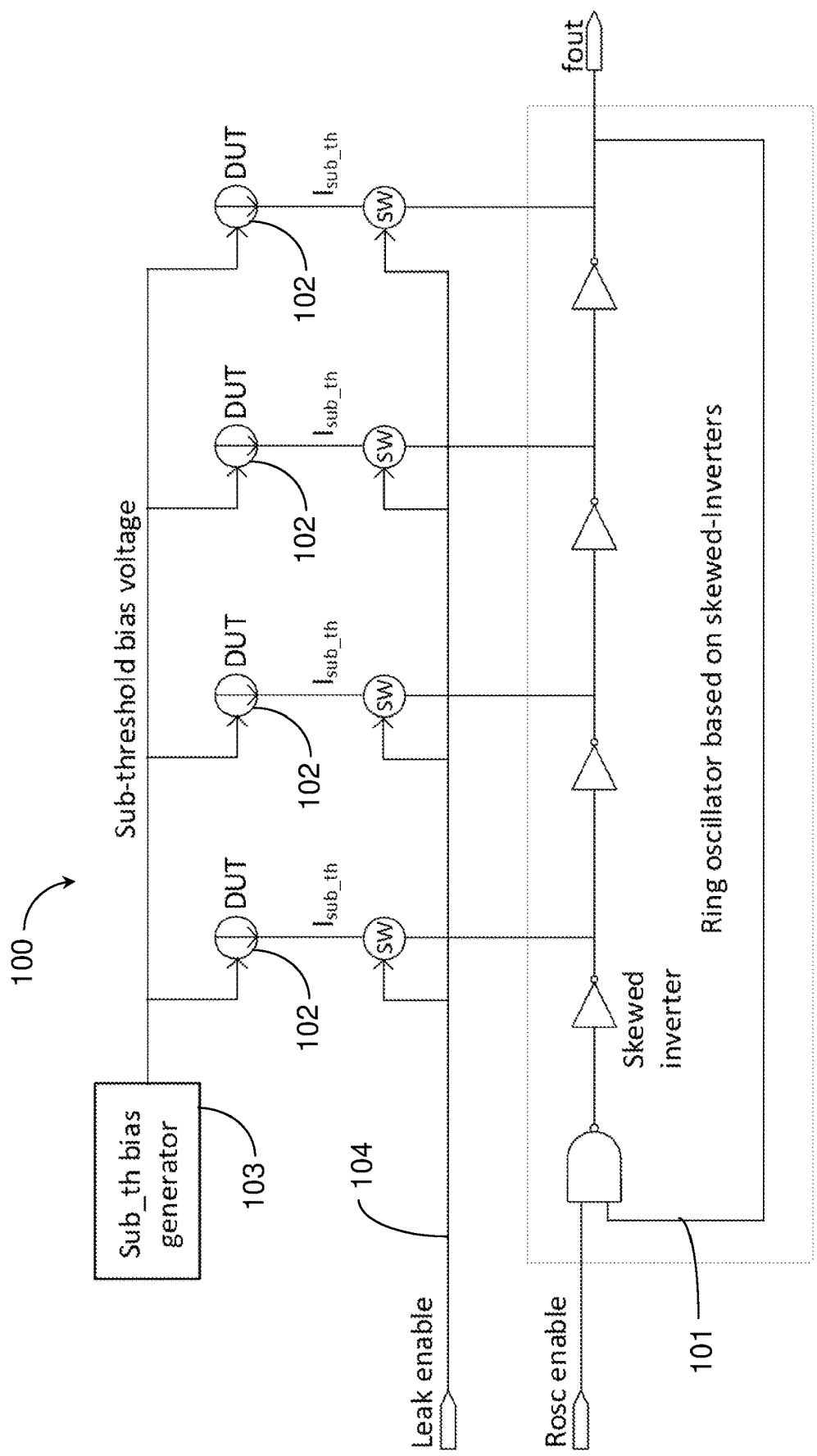
FIG. 1 shows schematically a high-level block diagram of a sensing circuit for IC power leakage detection.

Disclosed are IC sensors for determining operational characteristics of the IC, such as one or more on-die sensors, that identify and/or characterize one or more functional transistors (such as PMOS and/or NMOS transistors) located at different locations on the die. The sensor is an electronic circuit on the die that measures a characteristic or characteristics of a section of the die, such as a device under test (DUT), into a frequency change that may be measured. In particular, such sensors are based on a ring oscillator circuit, the frequency of which changes in accordance with the operational characteristic or characteristics being measured. The ring oscillator receives current (in particular, a leakage current) as an input from the functional transistor (or transistors).

In one example, an IC leakage sensor is provided, such as one or more on-die leakage sensors, which identify and/or characterize a sub-threshold leakage current of PMOS and/or NMOS transistors located at different locations on the die. The sensor is an electronic circuit on the die that converts the leakage current from a section of the die, such as a device under test (DUT), into a frequency change that may be measured, so that a leakage current may be calculated, and the leakage current value represented as a digital read-out. The leakage sensor(s) may detect n-channel MOSFETs (NMOSs) leakage and p-channel MOSFETs (PMOS) leakage separately.

Another example provides a sensor that detects temperature. An IC temperature sensor, such as one or more on-die temperature sensors, identify and/or characterize a temperature of PMOS and/or NMOS transistors located at different locations on the die. The sensor is an electronic circuit on the die that converts the temperature at a section of the die into a frequency change that may be measured, optionally a temperature calculated, and also optionally the temperature value represented as a digital read-out. The temperature sensor is based on a ring oscillator with current (in particular, a leakage current) provided as an input from a proximate functional transistor (or transistors). This current changes the dependence of the ring oscillator frequency on temperature. By adding the current, the temperature dependence becomes more accurate.

A similar example provides a sensor that detects workload or stress on a part or whole of the IC. An IC workload sensor, such as one or more on-die workload sensors may be based on the temperature sensor, but can identify and/or characterize a workload or stress at different locations on the die, calculate a workload, which may be represented as a digital read-out.

Optionally, the analysis of the sensor data is performed using IC profiling, IC classification, machine learning of IC power consumption (i.e. from single and multiple ICs), and/or the like.

In general terms, there may be considered a semiconductor integrated circuit (IC) comprising: a functional transistor, having an output providing an electrical current; a ring oscillator (ROSC) circuit, located in the IC proximate to the functional transistor and having an oscillation frequency in operation; and a processor, configured to determine one or more operating conditions of the functional transistor based on the oscillation frequency of the ROSC. Advantageously, the ROSC has an input coupled to receive the electrical current (such as a leakage current) from the output of the functional transistor. There may equivalently be considered a method for determining one or more operating conditions of a functional transistor in a semiconductor IC. An oscillation frequency is measured at the output of a ROSC located in the IC proximate to the functional transistor. One or more operating conditions of the functional transistor are determined based on the oscillation frequency of the ROSC. Advantageously, the ROSC receives an electrical current from an output of the functional transistor as an input. Any of the features disclosed herein may be considered with reference to the semiconductor IC and/or a method accordingly.

In embodiments, enabling part is configured to enable or disable the ROSC in accordance with a received enable signal. For example, the enabling part may comprise a NAND logic gate as part of the ROSC, a first input of the NAND logic gate being arranged to receive the enable signal and a second input of the NAND logic gate being coupled to an output of the ROSC. A switch may be provided to control supply of the (leakage) current from the functional transistor. The ROSC optionally comprises at least one skewed inverter. This may increase the sensitivity of the tested device, since the sensor (such as the ROSC configuration) may be specific to a functional transistor type (for example an n-device or p-device).

In embodiments. the processor is configured to use stored simulation results for the oscillation frequency of the ROSC at different operating conditions to determine the one or more operating conditions of the functional transistor.

The one or more operating conditions may be determined using a computing device, which may be a circuit on the semiconductor IC and/or an external device to the semiconductor IC. Where the computing device is an external device to the semiconductor IC, the computing device may receive a plurality of oscillation frequencies, for instance each from a respective one of a plurality of different locations on the same and/or each from one of a plurality of different ICs. The determining may then be performed using a fitted function taking as input the plurality of oscillation frequencies.

The input of the ROSC may be switchably coupling to receive the electrical current from the output of the functional transistor (such that the coupling may be selectively made or not made). Then, a reference frequency may be determined based on the oscillation frequency of the ROSC when the input of ROSC does not receive the electrical current from the output of the functional transistor. A sensor measurement frequency may be determined based on the oscillation frequency of the ROSC when the input of ROSC receives the electrical current from the output of the functional transistor.

Specific implementations will now be discussed, but further reference to the generalized sense will be made below.

Leakage Sensor

Reference is now made to FIG. 1, which shows schematically a high-level block diagram of a sensing circuit 100 for IC power leakage detection. Sensing circuit 100 includes a ring-oscillator (ROSC) 101 that is based on a skewed inverter. The sensing circuit tests one or more DUTs 102 that are implemented as a PMOS or an NMOS transistor. The sensing circuit includes a sub-threshold bias generation circuit 103, and leak enable switches (enabled by an enable lead 104) that electrically connects the leakage current from the DUTs into the oscillator internal nodes. The leakage current is measured at two steps:

1. The switch is open, the oscillator frequency is measured at no leakage condition and this value is used as a reference measurement.
2. The switch is closed, and the leakage current of the DUTs are electrically connected to the oscillator internal nodes. The frequency of the oscillator may change in direct proportion to the leakage current amplitude.

The ratio between the two measurements may be calculated and may be proportional to the DUTs sub-threshold leakage current amplitude. The reference measurement of step-1 may be used to adjust the frequency measurements for other effects, such as channel-length variation, to detect the DUTs sub-threshold leakage. The reference frequency may also be adjusted for other effects, such as local voltage drops, temperature, and/or the like.

The sub-threshold bias generation circuit (STBGC) 103 may increase the effect (i.e. increase the detection) of the sub-threshold leakage current. The STBGC may generate a source-to-gate voltage within the sub-threshold voltage range, which is higher than zero and therefor may amplify the DUTs sub-threshold leakage current.

Alternatively, the skewed inverters reduce the effects on the complementary device. For example, when the DUT is a PMOS, then the number of the ring-oscillator inverter NMOS devices may be positively skewed over the size of the PMOS devices, and vice versa.

Figure 2A:
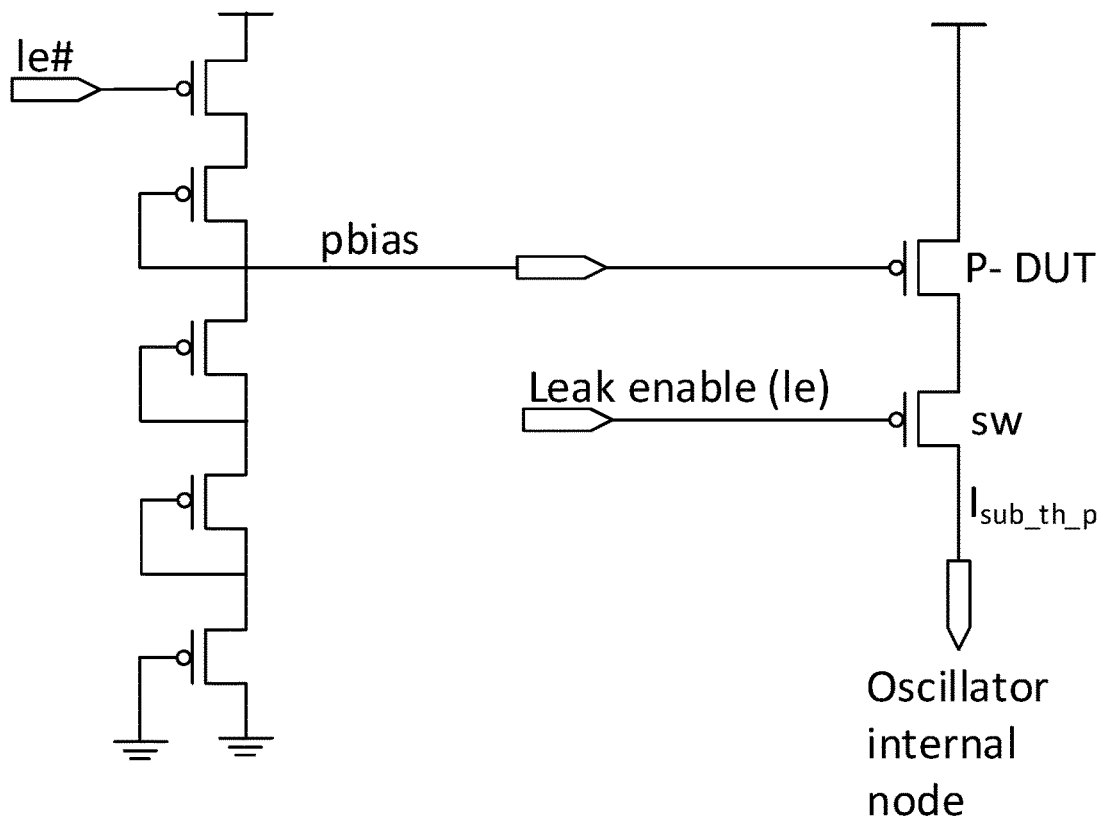
FIG. 2A shows the sub-threshold generation circuit, the P-DUT circuits of the PMOS sensors.
Figure 2B:
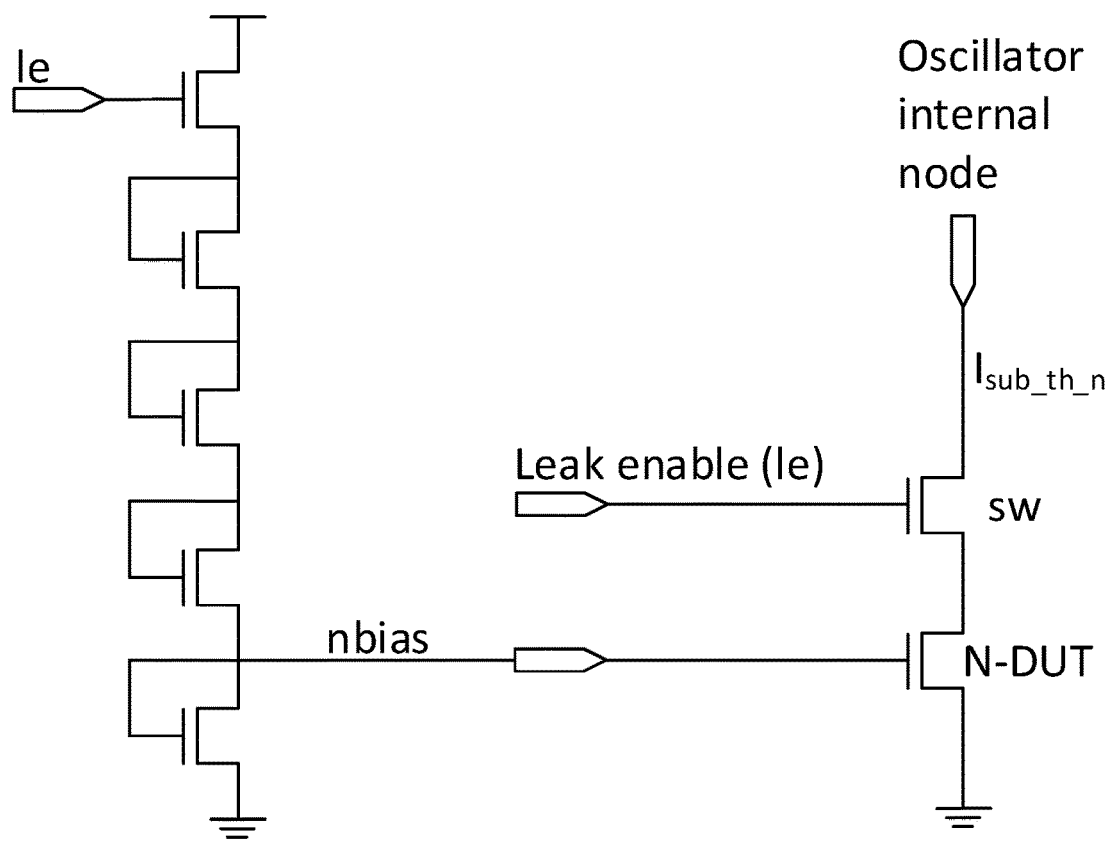
FIG. 2B shows the sub-threshold generation circuit, the N-DUT circuits of the NMOS sensors.

Reference is now made to FIG. 2A and FIG. 2B, which shows the sub-threshold generation circuit, the P-DUT and N-DUT circuits of the PMOS and NMOS sensors. The sub-threshold generation bias circuit generates a sub-threshold gate-to-source voltage by dividing the VDD voltage. The n-bias and p-bias voltages in the following implementation equal to VDD/4, the number of devices should assure gate-to-source voltage at the sub-threshold region or weak inversion.

The electronic conversion of IC leakage current to frequency, and measurement of the frequency to compute the IC leakage current, solves the problem of detecting IC leakage efficiently and with a small number of components. As advanced process technology scales down the threshold voltage, the static (leakage) power becomes a significant portion of the total power (static plus active) consumption of the IC. Existing solutions often use complicated analog circuits combined with analog-to-digital converters to detect the leakage current.

The leakage current is the sub-threshold current in the MOS-transistor between the source and drain when the MOS-transistor is OFF. The sub-threshold current of a MOSFET device when the transistor is at the sub-threshold region, i.e. gate-to-source voltage is below the threshold voltage. The sub-threshold current is significantly affected by the device threshold-voltage and device temperature.

The threshold voltage of the PMOS & NMOS devices is dependent on the manufacturing process. The devices of each IC design manufactured in a particular process (i.e. a particular foundry) may be associated with a certain threshold voltage distribution range. The threshold voltage may vary within the die (i.e. on-die threshold voltage variation effects), which may cause different threshold voltage distributions at different locations on a certain die. The variation of the device threshold voltage can cause variation of the static power consumption between dies and between different locations on the same die.

The multiple leakage sensor values from an individual IC may be considered the leakage profile of that IC, may measure the actual static power of an IC, and may predict the static power based on the leakage profile. This may apply to individual ICs, ICs from the same wafer (i.e. wafer location dependent leakage, etc.), ICs from the same lot, ICs from the same process, foundry, and/or the like. The leakage profile may be used for identification, security, monitoring, tracking, designing, troubleshooting, updating a design, and/or the like.

The leakage sensors may detect leakage from multiple DUTs on an individual IC, such as a die or part of a die, and the IC may use this information collected over time to monitor, track, detect operational anomalies, detect probability of future IC failure, and/or the like. Optionally, the IC may perform corrective or preventative action. For example, an IC uses the measurement of a leakage sensor to determine that the IC is performing within operational characteristics. For example, a mission critical IC uses the measurement of a leakage sensor to determine that the mission critical IC's failure is outside of a mission timeframe.

The data from leakage sensors on one or more ICs may be sent to a central computer to perform analysis of an ICs design and/or production, such as manufacturing site, process, lot, and/or the like. For example, detecting a different leakage profile from a lot may indicate that the lot is defective. For example, detecting a different leakage profile from a wafer may indicate that the wafer is defective. For example, detecting a different leakage profile from a process may indicate that the process is defective. For example, leakage profiles from a large number of ICs are made available to the central computer, and a machine learning analysis is performed to determine if there are classes of ICs that behave abnormally in the field. As an example of this, the machine learning may determine that the design may be improved to lower the standby power of the IC.

The leakage profiles may be individual and specific to an IC, and may be used to identify the IC, such as for security, for tracking, for monitoring, and/or the like. For example, a counterfeit IC from a different process/foundry may not display the same leakage profile as the authentic IC.

The leakage profile of individual and groups of ICs may provide new IC features, improved IC designs, improved efficiency of electronic devices, and/or the like.

Returning to the general terms considered above, the may ROSC forms part of at least one leakage detection circuit, for example such a leakage current is determined for the functional transistor based on the oscillation frequency of the ROSC. Then, the at least one leakage detection circuit may further comprise: a sub-threshold bias generator electrically connected to an input of a device under test (DUT), the DUT comprising the functional transistor and the ROSC being a first storage circuit that is electrically connected to an output of the DUT (such as a drain of the functional transistor); and a frequency measurement circuit.

In embodiments, the semiconductor IC further comprises an electronic switch electrically connected to the output of the DUT, the ROSC being electrically connected to the electronic switch.

In embodiments, the at least one leakage detection circuit is a plurality of leakage detection circuits, each measuring the leakage current from one of a plurality of DUTs.

Leakage Sensor Experimental Results

Following are the results of simulation experiments conducted by the inventors. The sub-threshold voltages may be technology dependent, such as determined by the foundry, process, and/or the like. The techniques and embodiments disclosed herein may be adapted for different process nodes, foundries, IC manufactures, and/or the like, with appropriate modifications to the sub-threshold voltage levels.

Figure 3A:
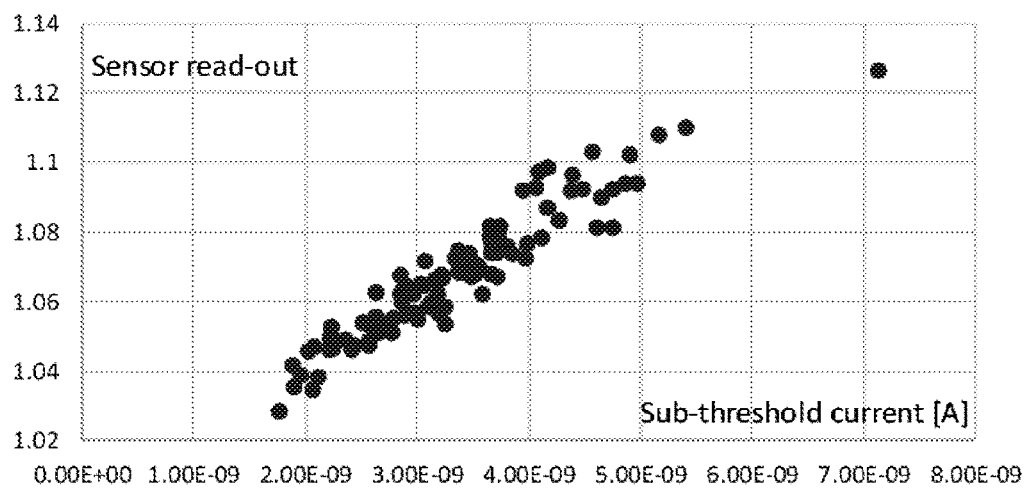
FIG. 3A shows P-DUT simulation results for IC leakage sensing.
Figure 3A:
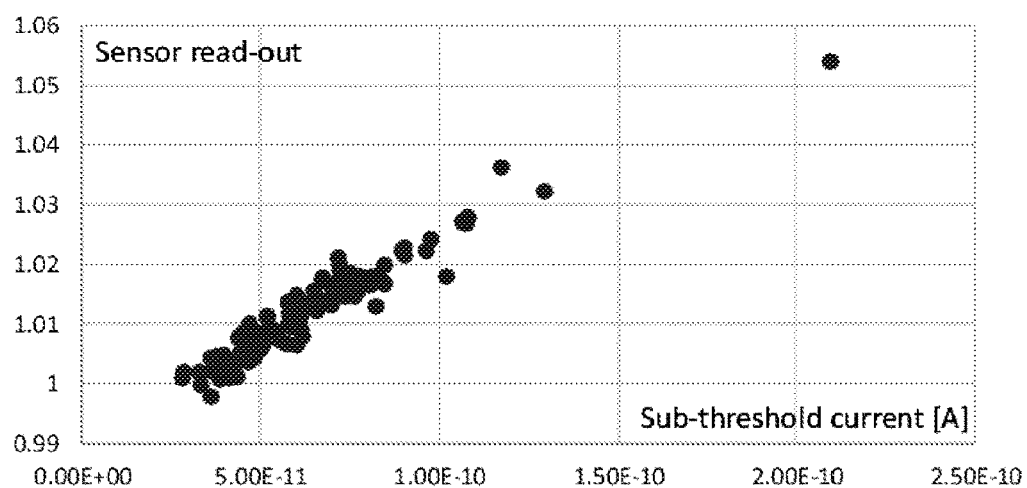
Figure 3A:
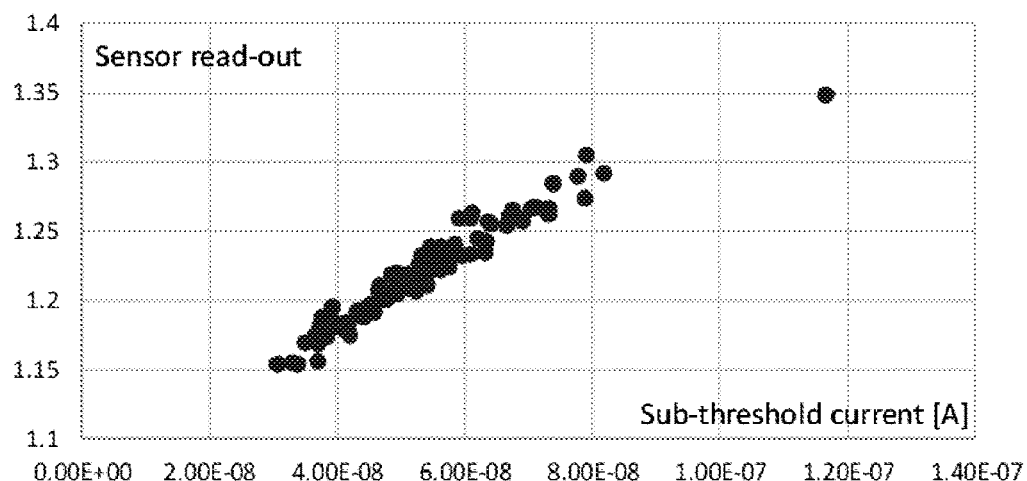
Figure 3B:
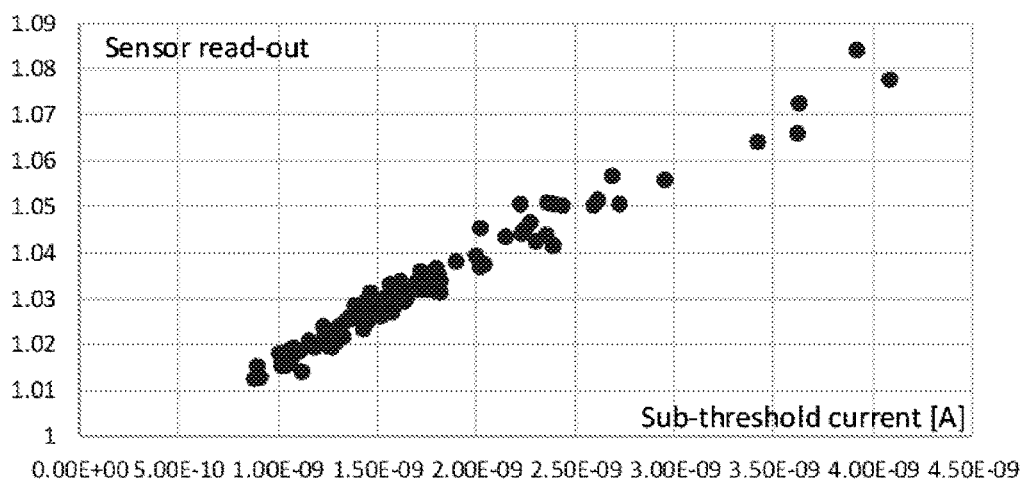
FIG. 3B shows N-DUT simulation results for IC leakage sensing.
Figure 3B:
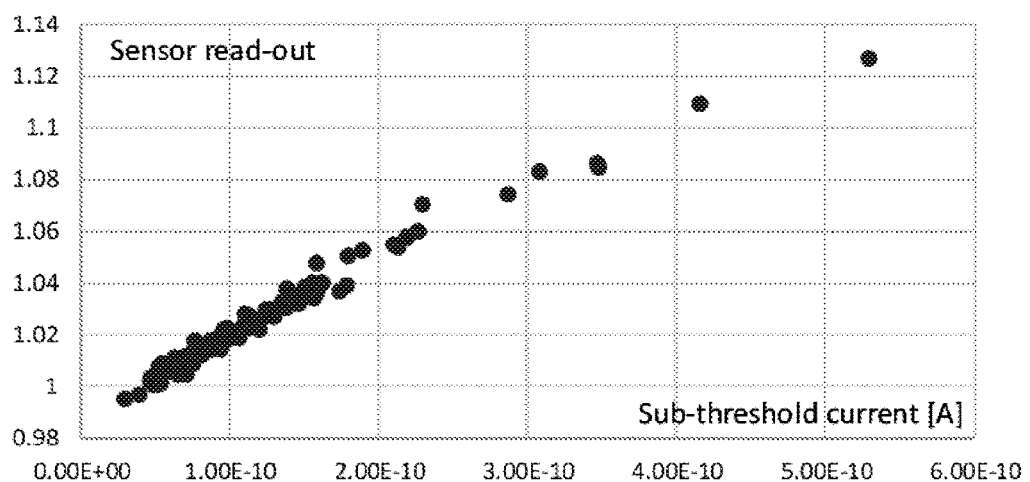
Figure 3B:
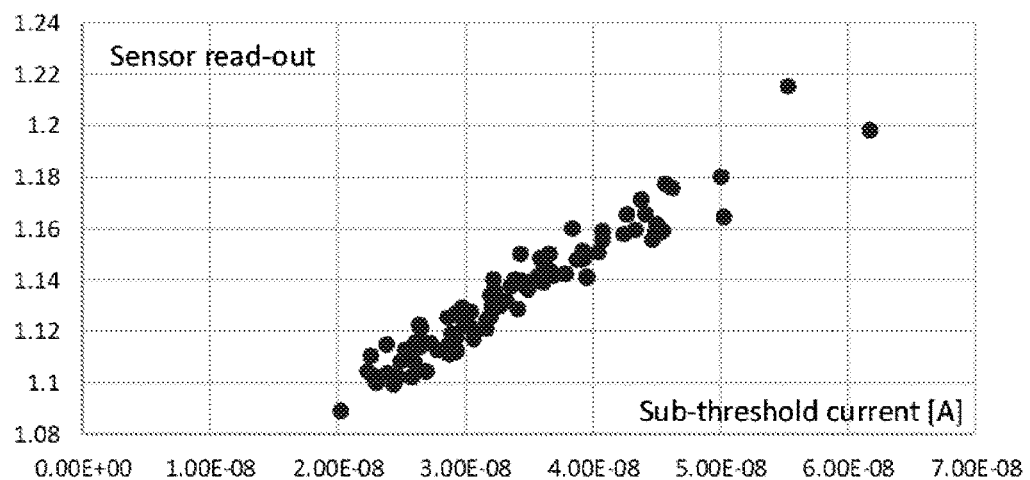

Reference is now made to FIG. 3A and FIG. 3B, which shows P-DUT and N-DUT simulation results for IC leakage sensing. The simulations were done on PMOS and NMOS devices representing 3 different sub-threshold voltages: Low Voltage Threshold (LVT), Standard Voltage Threshold (SVT), and Ultra-Low Voltage Threshold (ULVT). The simulation results use a notation of device type (N or P) and sub-threshold voltages level are combined as a single abbreviation, such as NLVT or the like. Thus, a P-type CMOS DUT simulated at LVT will be denoted PLVT. The simulations were done at the following conditions:

Device temperature of 25 degrees centigrade (a temperature where the sub-threshold current amplitude is significantly low), and Gate-source voltage equal to 0V.

The sensor read-out (i.e. frequency ratio) was compared to the measured sub-threshold current amplitude with wide range of threshold-voltages generated by a Monte-Carlo simulation process. The simulated results show a correlation higher than 0.9 (r) between the sensor read-out and the transistor sub-threshold current amplitude at all device types.

TABLE 1

Simulated result correlations between sensor frequency and leakage current for different devices at different voltages.

| Device type and voltage | Correlation (r) |
| --- | --- |
| NLVT | 0.98 |
| NSVT | 0.99 |
| NULVT | 0.96 |
| PLVT | 0.95 |
| PSVT | 0.96 |
| PULVT | 0.97 |

Temperature and/or Workload Sensor

For temperature and/or workload sensor, a ROSC is added to the computerized design of a chip, in a location where temperature and/or workload measurement is desired. A current is added to feed the ROSC, in a similar manner to that described above with reference to the leakage sensor. The current generator increases the sensitivity of the ROSC to temperature changes, such that even a small change in temperature will result in a large change in oscillation frequency. Moreover, the current generator changes the correlation between ring oscillator frequency and temperature, such that an increase in temperature causes an increase in ring oscillator frequency. The current generator is fed from an output current of a transistor and preferably a leakage current (particularly, current that leaks from the gate of the transistor to its drain, when the gate is driven at a voltage lower that the threshold voltage of the transistor). The ROSC receives this leakage current as an input. This will be discussed further below.

Such a sensor also allows workload and/or stress for the IC (or at least a portion of it) to be detected. Workload or stress is generally considered a function of IC voltage, IC temperature and/or IC activity over time. The voltage of the chip is known (or can be detected), and the temperature may be measured using a ROSC, as noted above. It may also be known or detected as for how long the chip was run under these voltage and temperature conditions. In this way, a stress or workload index can be detected or logged as it changes over time. In practice, an aggregated workload index is provided, which indicates the integral (or aggregate) of the workload over a time interval (for example, the period between the last measurement and the current measurement).

Figure 4:
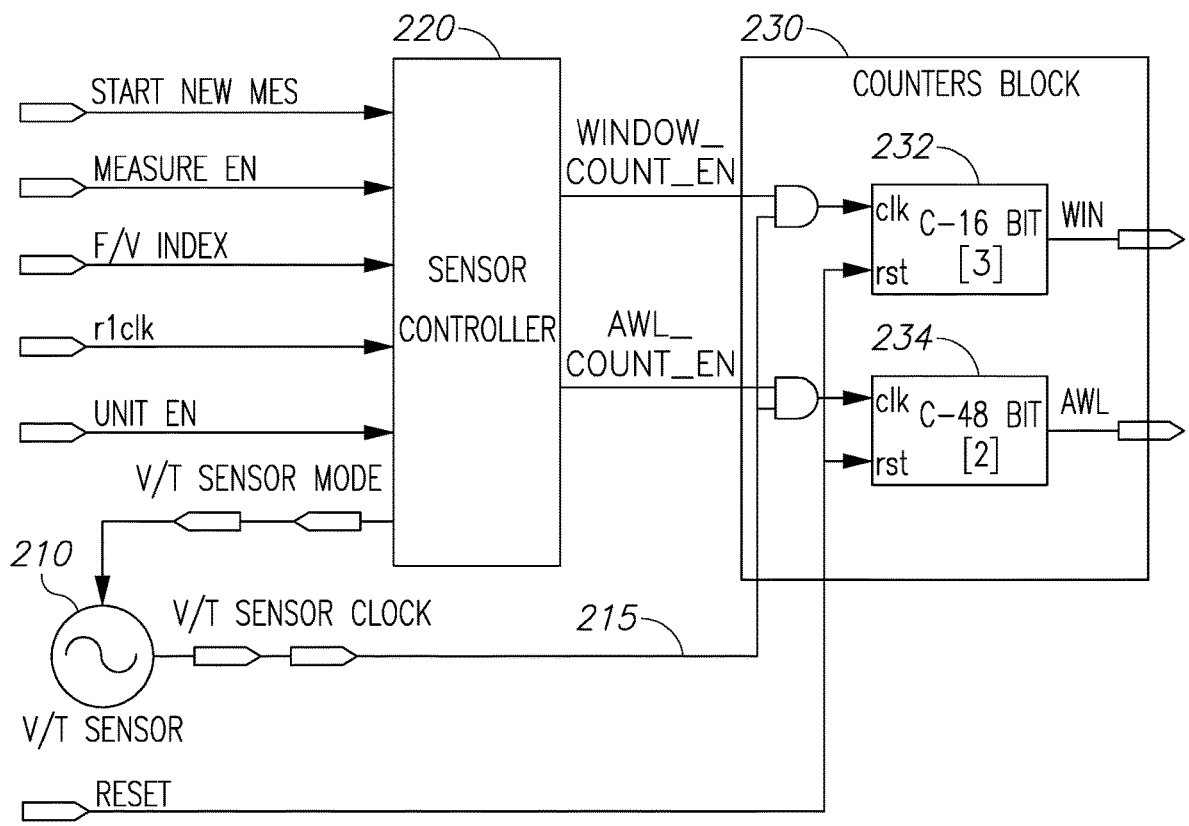
FIG. 4 shows a schematic block diagram of a system for detecting workload for an IC.

Reference is now made to FIG. 4, which shows a schematic block diagram of a system for detecting workload for an IC. This comprises: a Voltage/Temperature (V/T) sensor 210; a sensor controller 220; and a counters block 230. The sensor controller 220 provides a mode signal to the V/T sensor 210, which cause enablement (V/T-mode) or disablement (REF-mode) of providing a leakage current ROSC (for example, ROSC 101, as shown in FIG. 1) within the V/T sensor 210. The ROSC produces an output signal with an oscillation frequency that indicates the detected temperature when the ROSC is provided with the leakage current (V/T-mode) and indicates a base frequency when the ROSC is not provided with the leakage current (REF-mode). This is considered a sensor clock signal 215 in the sensor of FIG. 4 and provided to the counter block 230 as an input.

The counter block 230 comprises: a 16-bit counter 232; and a 48-bit counter 234, both of which are provided with the sensor clock signal 215. The 16-bit counter 232 is configured to provide a WIN value (readout) as an output, which reflects the frequency of the V/T-sensor 210 in REF-mode and the system-clock frequency. During the WIN value generation, the counter 232 is gated by a Window_count_en signal that is generated by the sensor controller 220. The width of the gating signal is equal to N times the system-clock period. N may be a programmable value. A higher system-clock frequency will generate a smaller WIN value and vice versa. The WIN readout can be used as a reference-base-line for the workload measurement. It represents the process corner and the frequency of operation.

The 48-bit counter 234 is configured to provide an Active Work Load (AWL) signal as an output. The AWL output reflects the aggregated workload at a certain time-interval. This allows recording or logging of stress or workload over a period of time longer than a single time-interval (and typically, at least 2, 5, 10, 50, 100, 500 or 1000 time-intervals). The time interval value may be calculated using the chip firmware data as the time between start and stop measurement or by counting the system-clock frequency as the number of system-clock cycles between start and stop measurement (not shown in FIG. 4).

In order to normalize the aggregated work-load per a certain time-interval and frequency, the AWL value can be divided by the reference-base-line value times the time-interval.

Although the sensor system shown in FIG. 4 provides one type of workload output, the workload index may be manifested in a variety of ways. It could be a percentage value that is common to all chips of the same bin (as discussed below), or more generally of the same model. It could be any other numerical value. The stress log may be saved in a non-volatile memory on the chip itself, and periodically uploaded to the system for storage on its hard-drive, for example. The system may periodically transmit the log to the manufacturer over the Internet.

Figure 5:
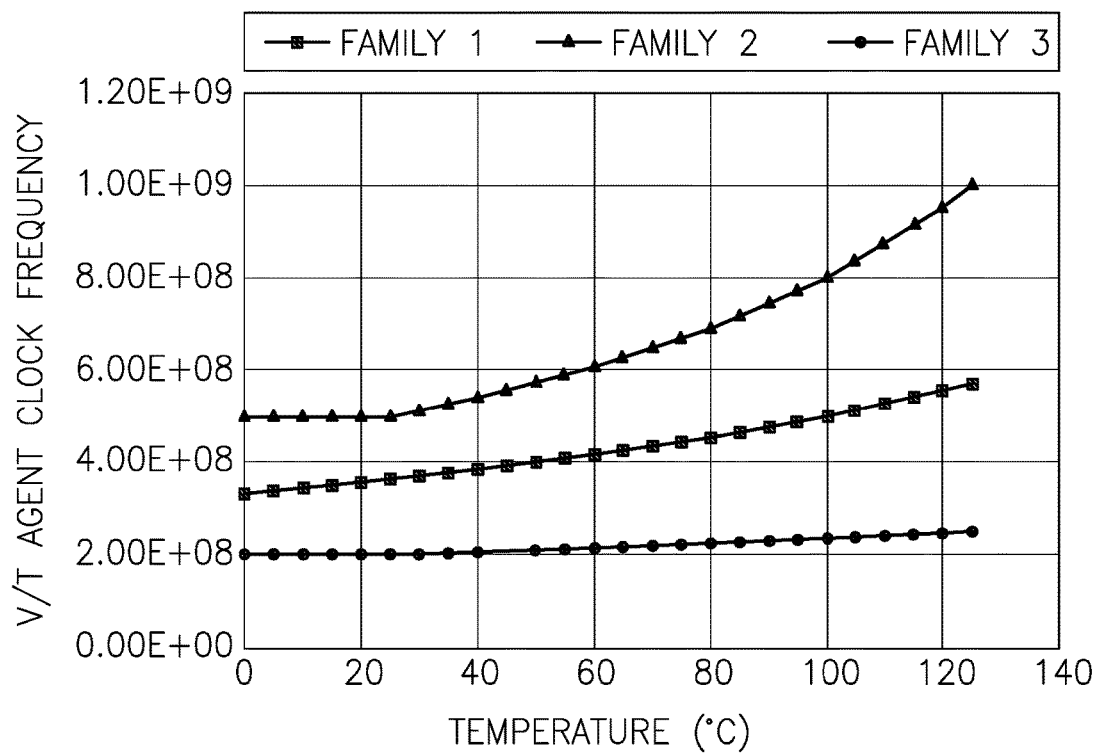
FIG. 5 shows exemplary plots of clock frequency against temperature for a sample sensor for the system of FIG. 4.

Reference is now made to FIG. 5, which shows exemplary plots of clock frequency against temperature for a sample sensor for the system of FIG. 4. The plots of clock frequency against temperature are shown for three different families of IC. The sensor in family 1 has the highest clock frequency and, at least above a certain temperature, the highest rate of increase in clock frequency per unit temperature. The sensor in family 3 has the lowest clock frequency and the lowest rate of increase in clock frequency per unit temperature. The sensor in family 2 sits between the sensors of families 1 and 3 in respect of the clock frequency. However in all cases, increasing temperature causes an increase in clock frequency.

On the basis of such an approach, it may be possible to obtain an accurate temperature (and thus a more accurate measure of workload) using the sensor of the present disclosure. This recognizes that sensors on different ICs may have different relationships between ROSC clock frequency and temperature. For example, this may be because the relationship between the ROSC output frequency and temperature is process dependent (although more predictable and accurate than existing approaches). Moreover, similar IC Families typically have the same relationship between the ROSC output frequency and temperature. A Family in this context may refer to a group of ICs classified as having a common parameter that is close in value. For example, this may be a group of physical dies with the same Si-profile/classification. In addition, a family may include a group of Monte-Carlo (MC) samples, for which the simulated IC Design Simulation Values and the Device-Process Simulated Values have the same Si-profile/classification as those of the physical family members. More details about IC family classification are described in the U.S. provisional patent application No. 62/675,986 Entitled "INTEGRATED CIRCUIT PROFILING AND ANOMALY DETECTION", filed Apr. 16, 2018, the contents of which are incorporated herein by reference in their entirety.

One way to determine temperature and/or workload based on ROSC frequency is by, before the IC is manufactured, running simulations a computerized version of the IC design to estimate the expected manufacturing inaccuracies. This yields a categorization of the theoretical chips according to their characteristics. This is similar to the well-known technique of "product binning", but performed only in a computer simulation. The simulations also check the reaction of the IC to different temperatures, so that the variation of the ROSC frequency with respect to temperature can be determined, categorized and stored. Examples are shown in Table 2 below (although it should be noted that, in reality, the reaction of the ROSC frequency to temperature need not be linear and may be non-linear, for instance defined by more complex polynomials).

TABLE 2

| | Reaction to temperature |
|---|---|
| Chip category 1 | 10 MHz increase of oscillation frequency of the ROSC per each degree Celsius |
| Chip category 2 | 18 MHz increase of oscillation frequency of the ROSC per each degree Celsius |
| Chip category 3 | 30 MHz increase of oscillation frequency of the ROSC per each degree Celsius |

After the simulation results have been completed (although this order is not necessary), the chips are fabricated. Physical tests are run on the chips to associate each individual chip with its category from the earlier simulations. Thus, to measure the temperature (and/or workload) according to this approach using an ROSC of a specific chip: the ROSC frequency of oscillation is measured; and the frequency is compared to the data from the simulation, according to the category of that specific IC.

The data obtained using such sensors can be used in a variety of way. With a large group of similar parts, statistical lifetime workload comparisons can provide insights into their distribution. Additionally or alternatively, during the investigation of the failure of a specific part, workload information may represent the state of part aging or deterioration. In another approach, detection of workload over a pre-set threshold (or some other criterion) may be used for notification purposes, for example as part of preventive or predictive maintenance. Then, a call for replacement of a: specific part (for instance: in the automotive market); or of a group or class (for example, replacing a specific component in all units of a data center). During post-manufacture testing, outputs of the workload sensor may be included in a test-plan, during post-manufacture testing. This may enable better visibility for the calibration of the results. Further applications are discussed below and others may be considered.

Figure 6:
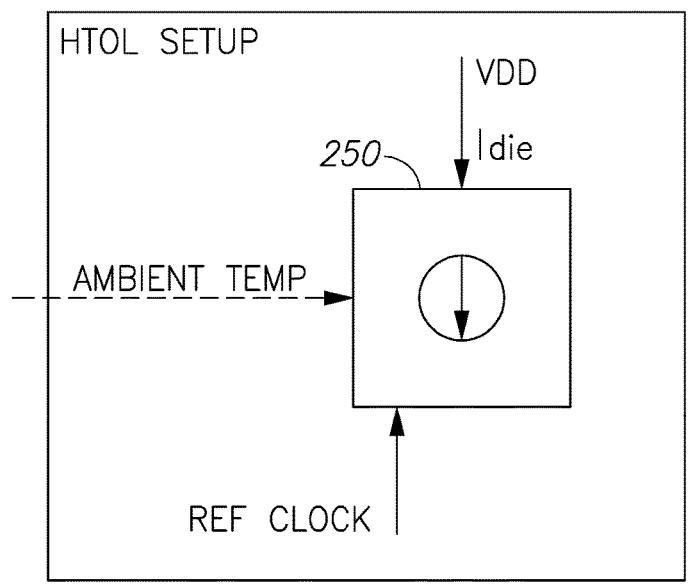
FIG. 6 shows schematically a setup configuration for determining High Temperature Operating Life (HTOL) stress.

Reference is now made to FIG. 6, which shows schematically a setup configuration for determining High Temperature Operating Life (HTOL) stress. The die 250 receives IC supply voltage (VDD), a reference clock and an ambient temperature indication or measurement and draws a die current (Idie). As discussed above with reference to temperature measurement, dies from the same family are expected to show the same behavior when performing at a similar environment such as HTOL (in terms of VDD, Idie, leakage current and temperature) and against HTOL stress. Thus, measurement of Work-load during the HTOL test and with knowledge of the Family (as discussed above) can provide an indication of HTOL stress against different dies of the same Family. Any exceptional readout can be interpreted as an outlier.

Workload or stress readouts can also be correlated with application-based stress. For example, an application can be associated with a temperature wave over time. Dies from the same family (as discussed above) are expected to show the same behavior when running the same application. A workload corresponding to the Pre-Si Aging temperature can be used as a reference workload and thereby a relative stress per application can be determined.

Figure 7:
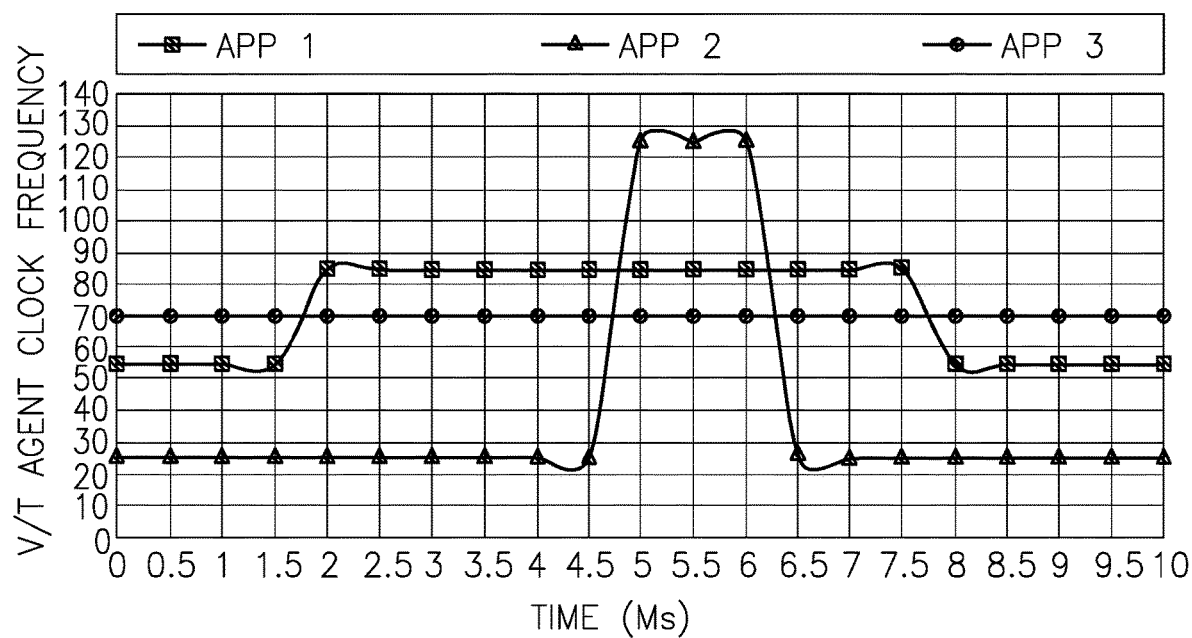
FIG. 7 shows exemplary plots of temperature over time for an IC running different applications.

Reference is now made to FIG. 7, which shows exemplary plots of temperature (in degrees centigrade) over time (in ms) for an IC running different applications. The line at 70° C. represents a reference level. The temperature profiles for two applications are then shown: for the first application (App 1), the temperature is raised from about 55° C. to about 90° C. for around 5 to 7 ms; and for the second application (App 2), the temperature is raised from about 25° C. to about 125° C. for around 1 to 2 ms.

A workload corresponding to the Pre-Si aging that was simulated at a certain (predicted) temperature can be used as a reference workload to be compared with a Post-Si measured workload, to estimate the relative stress per application. The comparison information may be used to determine optional power and/or performance improvement per application.

By generating a repetitive test and reading the workload readout at small time-intervals, a mission-profile based on the readout can be extracted. The extracted mission profile can be used to measure the average stress and determine the reliability margin of the next die (in terms of aging and/or RV). For example, the extracted mission profile can be used to detect a fast temperature gradient that can be correlated with thermal reliability issues, such as the high gradient shown in the temperature increase from about 25° C. to about 125° C. for the second application in FIG. 7.

In such ways, stress logs that have been collected from end users by the manufacturer can be used for enhancing the mission profile of subsequently-manufactured chips. Usually, the manufacturer determines the operational margin of the chips (their "guard-band") by estimating the mission profile of the chips. For example, chips intended for server farms are more likely to work longer hours but experience low ambient temperature due to efficient cooling, while chips used in home computers might work less, but occasionally be exposed to high ambient temperatures. Using existing techniques, manufacturers usually make chips with high margins, to avoid failure even under harsh conditions. By knowledge of the actual stress levels chips actually undergo in the field, manufacturers can perhaps lower the margins accordingly.

Figure 8:
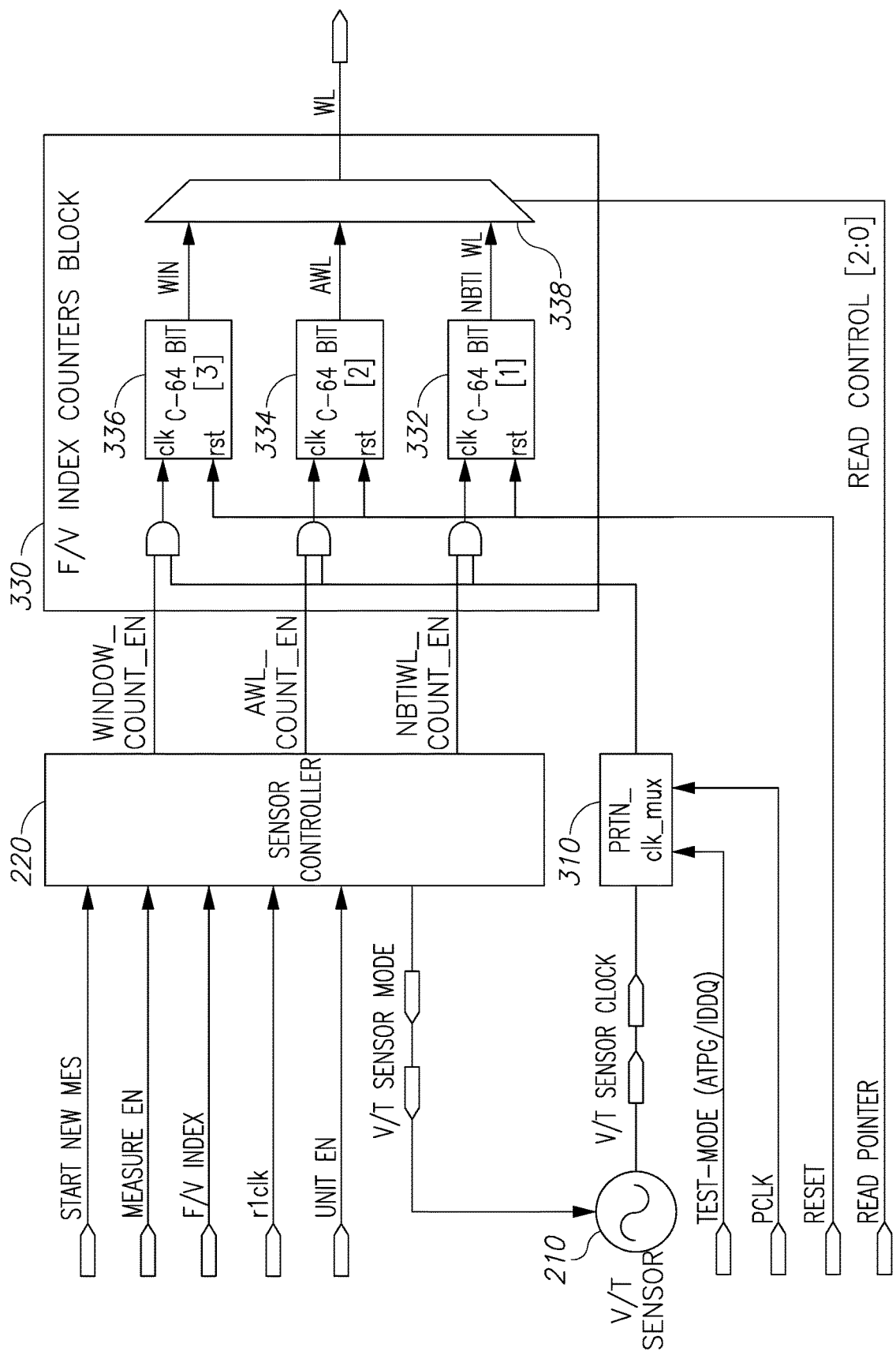
FIG. 8 shows a schematic block diagram of a system for detecting negative-bias temperature instability (NBTI) workload.

The work-load measurement may expand to measure directly Negative-bias temperature instability (NBTI) workload, i.e., the stress during a non-active period. Reference is now made to FIG. 8, which shows a schematic block diagram of a system for detecting and measuring NBTI workload. Where the same features are shown as represented in other drawings, these have been indicated using the same reference numerals. The system includes: a Voltage/Temperature (V/T) sensor 210; a sensor controller 220; a clock multiplexer 310; and a counters block 330. The counters block 330 comprises: a first 64-bit counter (counter-1) 332; a second 64-bit counter (counter-2) 334; a third 64-bit counter (counter-3) 336; and an output multiplexer 338.

The basic operation is similar to the system shown in FIG. 4, but with some differences. In this system, the first counter (counter-1) 332 is configured to count the ROSC clock from the V/T sensor 210 when the enable signal is low. When the enable is low, the logic gates that associated with the enable are placed in a park-mode and degraded according to a NBTI law. The second counter (counter-2) 334 is configured to measure AWL and the third counter (counter-3) 336 is configured to measure WIN, as discussed above. The output multiplexer 338 is arranged to select the output.

Figure 9:
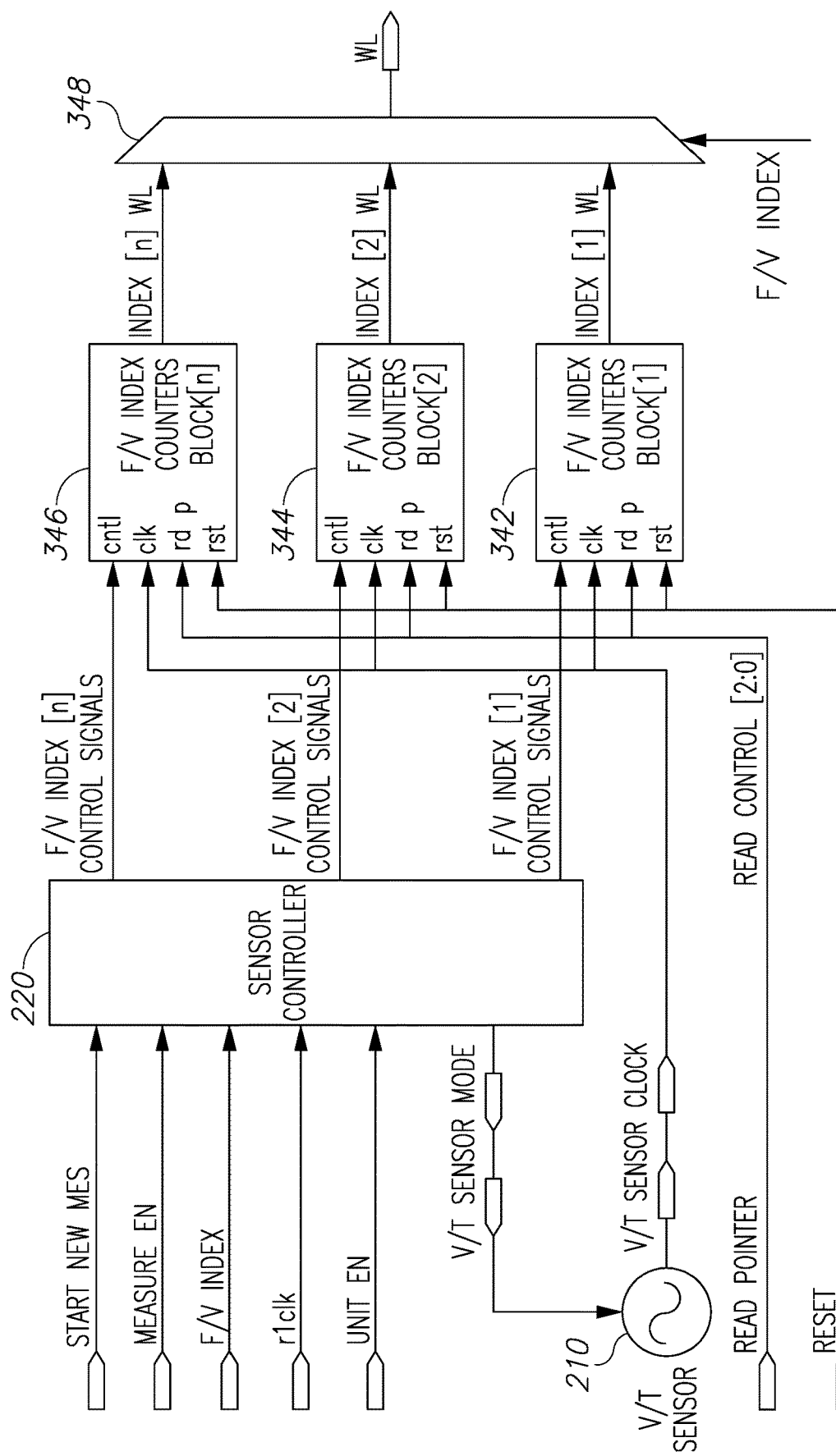
FIG. 9 shows a schematic block diagram of a system for detecting workload per frequency and/or voltage.

The workload measurement may be expanded to measure workload in systems in which the voltage and/or frequency are not fixed, for example when they are constantly changed by the operating system or by the die power-management unit, such as to optimize the system power and/or performance. Reference is now made to FIG. 9, which shows a schematic block diagram of a system for detecting workload per frequency and/or voltage and specifically, workload per frequency/voltage pair (represented by an F/V index). Where the same features are shown as represented in other drawings, these have been indicated using the same reference numerals. The system comprises: a first counter block 342; a second counter block 344; a third counter block 346; and an output multiplexer 348. In this system, the counters are multiplied by the number of F/V indexes, and the readout is output per F/V-index using a suitable Read-control signal.

In terms of the generalized sense discussed above, further embodiments may be considered. For instance, the ROSC and the processor may form part of at least one temperature detection circuit. A temperature for the functional transistor is thereby determined based on the oscillation frequency of the ROSC. In that case, stored simulation results may be used for the oscillation frequency of the ROSC at different temperatures to determine the temperature of the functional transistor based on the oscillation frequency of the ROSC. In embodiments, the IC may be identified as having a type selected from a group consisting of a plurality of predefined types of IC. Respective simulation results for the oscillation frequency of the ROSC at different temperatures may be stored for each of the predefined types.

Beneficially, the oscillation frequency of the ROSC increases with increasing temperature. Advantageously, the at least one temperature detection circuit further comprises a current source, an output of the current source providing an input to the ROSC. This may improve temperature sensitivity and measurement accuracy. Preferably, the current source comprises a sub-threshold bias generator coupled to a control terminal of the functional transistor and configured to bias the functional transistor in a sub-threshold state, an output of the functional transistor providing the output of the current source (for instance, as part of a leakage detection circuit as discussed above).

In embodiments, a stress or workload for the IC is determined based on the oscillation frequency of the ROSC. Optionally, the stress or workload for the IC is determined based on a function of one or more of: IC voltage; temperature; and IC activity. In embodiments, the stress or workload is determined at different values of one or both of: a clock frequency for the semiconductor IC (that is, the clock frequency used for the functional components, such as functional transistors); and an operating voltage for semiconductor IC (such as VDD). In particular, the stress or workload may be determined for a pair of clock frequency and operating voltage. The stress or workload is advantageously referenced against the clock frequency and/or operating voltage. In embodiments, the stress or workload for the IC represents an aggregate stress or workload over a time interval. In particular, the time interval may be based on a time duration for measurement of the oscillation frequency of the ROSC. Optionally, the stress or workload is represented by one or more of: a number; a ratio with respect to a reference value for all semiconductor ICs; and a ratio with respect to a reference value for semiconductor ICs of the same type.

A margin loss for the semiconductor IC may be correlated with the stress or workload. Additionally or alternatively, a margin loss for the IC may be determined based on the determined stress or workload and a stored correlation between stress or workload and margin loss.

A Negative-bias temperature instability (NBTI) mode may be selectively enabled or disabled for at least a portion of the semiconductor IC. Then, a stress or workload for the NBTI mode may be determined, when the NBTI mode is enabled.

In embodiments, a notification signal is generated based on a comparison of the determined stress or workload with a predetermined criterion, the notification signal being indicative of one or more of: a state or age of the IC; one or more guard-bands for the IC; and a maintenance or replacement condition.

Advantageously, the determined stress or workload may be compared with a predetermined criterion. Optionally, the predetermined criterion is based on a statistical lifetime workload for semiconductor ICs of the same type as the semiconductor IC. Test results for the semiconductor IC may be calibrated based on the stress or workload.

Optionally, multiple instances of the one or more operating conditions spread over a time period. Then, the determined multiple instances of the one or more operating conditions may be stored, for instance in one or more of: a non-volatile memory in the semiconductor IC; an external storage device on a local system; and an external storage device on a remote system over a network. In embodiments, an aggregate value for the determined multiple instances of the one or more operating conditions over the time period.

A plurality of sets of stress or workload may be determined for the IC, each set of stress or workload being determined from ROSC oscillation frequencies occurring during operation of a respective application by the semiconductor IC. Then, each set of stress or workload may comprise multiple instances of stress or workload, spread over a time period.

General Points

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

In the description and claims of the application, each of the words "comprise" "include" and "have", and forms thereof, are not necessarily limited to members in a list with which the words may be associated. In addition, where there are inconsistencies between this application and any document incorporated by reference, it is hereby intended that the present application controls.

To clarify the references in this disclosure, it is noted that the use of nouns as common nouns, proper nouns, named nouns, and the/or like is not intended to imply that embodiments of the invention are limited to a single embodiment, and many configurations of the disclosed components can be used to describe some embodiments of the invention, while other configurations may be derived from these embodiments in different configurations.

In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Moreover, the various features and embodiments of the invention described above are specifically contemplated to be used alone as well as in various combinations.

Conventional and/or contemporary circuit design and layout tools may be used to implement the invention. The specific embodiments described herein, and in particular the various thicknesses and compositions of various layers, are illustrative of exemplary embodiments, and should not be viewed as limiting the invention to such specific implementation choices. Accordingly, plural instances may be provided for components described herein as a single instance.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, which are intended to define the scope of this invention. In particular, even though the preferred embodiments are described in the context of a PLL operating at exemplary frequencies, the teachings of the present invention are believed advantageous for use with other types of circuitry in which a circuit element, such as an inductor, may benefit from electromagnetic shielding. Moreover, the techniques described herein may also be applied to other types of circuit applications. Accordingly, other variations, modifications, additions, and improvements may fall within the scope of the invention as defined in the claims that follow.

Embodiments of the present invention may be used to fabricate, produce, and/or assemble integrated circuits and/or products based on integrated circuits.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. Rather, the computer readable storage medium is a non-transient (i.e., not-volatile) medium.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. The skilled person will appreciate that combinations and sub-combinations of specific features disclosed herein may also be provided, even if not explicitly described.

What is claimed is:

1. A semiconductor integrated circuit (IC) comprising:
   a functional transistor, having an output providing an electrical current;
   a ring oscillator (ROSC) circuit, located proximate to the functional transistor and having an oscillation frequency in operation; and
   a processor, configured to determine one or more operating conditions of the functional transistor based on the oscillation frequency of the ROSC;
   wherein the ROSC has an input coupled to receive the electrical current from the output of the functional transistor.

2. The semiconductor IC of claim 1, wherein the processor is configured to use stored simulation results for the oscillation frequency of the ROSC at different operating conditions to determine the one or more operating conditions of the functional transistor.

3. The semiconductor IC of claim 1, wherein the ROSC forms part of at least one leakage detection circuit, such that the processor is configured to determine a leakage current for the functional transistor based on the oscillation frequency of the ROSC.

4. The semiconductor IC of claim 3, wherein the at least one leakage detection circuit further comprises:
   a sub-threshold bias generator electrically connected to an input of a device under test (DUT), the DUT comprising the functional transistor and the ROSC being a first storage circuit that is electrically connected to an output of the DUT; and
   a frequency measurement circuit.

5. The semiconductor IC of claim 4, further comprising:
   an electronic switch electrically connected to the output of the DUT, the ROSC being electrically connected to the electronic switch.

6. The semiconductor IC of claim 4, wherein the output of the DUT is a drain of the functional transistor.

7. The semiconductor IC of claim 4, wherein said at least one leakage detection circuit is a plurality of leakage detection circuits, each measuring the leakage current from one of a plurality of DUTs.

8. The semiconductor IC of claim 1, wherein the ROSC and the processor form part of at least one temperature detection circuit, such that the processor is configured to determine a temperature for the functional transistor based on the oscillation frequency of the ROSC.

9. The semiconductor IC of claim 8, wherein the processor is further configured to use stored simulation results for the oscillation frequency of the ROSC at different temperatures to determine the temperature of the functional transistor based on the oscillation frequency of the ROSC.

10. The semiconductor IC of claim 8, wherein the processor is further configured to identify the IC as having a type selected from a plurality of predefined types of IC, the processor storing respective simulation results for the oscillation frequency of the ROSC at different temperatures for each of the predefined types.

11. The semiconductor IC of claim 8, wherein the at least one temperature detection circuit further comprises a current source, an output of the current source providing an input to the ROSC.

12. The semiconductor IC of claim 11, wherein the current source comprises a sub-threshold bias generator coupled to a control terminal of the functional transistor and configured to bias the functional transistor in a sub-threshold state, an output of the functional transistor providing the output of the current source.

13. The semiconductor IC of claim 12, wherein the sub-threshold bias generator forms part of at least one leakage detection circuit that comprises:
   a sub-threshold bias generator electrically connected to an input of a device under test (DUT), the DUT comprising the functional transistor and the ROSC being a first storage circuit that is electrically connected to an output of the DUT; and
   a frequency measurement circuit.

14. The semiconductor IC of claim 1, wherein the processor is configured to determine a stress or workload for the IC based on the oscillation frequency of the ROSC and on a function of one or more of: IC voltage, IC temperature, and IC activity.

15. The semiconductor IC of claim 14, wherein the processor is further configured to:
   determine the stress or workload at different values of one or both of: a clock frequency for the semiconductor IC, and an operating voltage for semiconductor IC; and
   provide the stress or workload referenced against the clock frequency and/or operating voltage.

16. The semiconductor IC of claim 15, wherein the stress or workload for the IC represents an aggregate stress or workload over a time interval, the time interval being based on a time duration for measurement of the oscillation frequency of the ROSC.

17. The semiconductor IC of claim 15, wherein the stress or workload is represented by one or more of: a number; a ratio with respect to a reference value for all semiconductor ICs, and a ratio with respect to a reference value for semiconductor ICs of the same type.

18. The semiconductor IC of claim 14, wherein the processor is further configured to receive a margin loss for the semiconductor IC and correlate the received margin loss with the stress or workload.

19. The semiconductor IC of claim 14, wherein the processor is further configured to determine a margin loss for the IC based on the determined stress or workload and a stored correlation between stress or workload and margin loss.

20. The semiconductor IC of claim 14, wherein the processor is further configured to selectively enable or disable a Negative-Bias Temperature Instability (NBTI) mode for at least a portion of the semiconductor IC, and determine a stress or workload for the NBTI mode when the NBTI mode is enabled.

21. The semiconductor IC of claim 14, wherein the processor is further configured to generate a notification signal based on a comparison of the determined stress or workload with a predetermined criterion, the notification signal being indicative of one or more of: a state or age of the IC, one or more guard-bands for the IC, and a maintenance or replacement condition.

22. The semiconductor IC of claim 1, wherein the input of said ROSC is switchably coupled to receive the electrical current from the output of the functional transistor, such that the processor is configured to determine:
- a reference frequency based on the oscillation frequency of the ROSC when the input of ROSC does not receive the electrical current from the output of the functional transistor; and
- a sensor measurement frequency based on the oscillation frequency of the ROSC when the input of ROSC receives the electrical current from the output of the functional transistor.

* * * * *